US008293557B2

(12) United States Patent
Inoue et al.

(10) Patent No.: US 8,293,557 B2
(45) Date of Patent: Oct. 23, 2012

(54) MANUFACTURING METHOD OF MEMS DEVICE, AND SUBSTRATE USED THEREFOR

(75) Inventors: Hiroaki Inoue, Kawasaki (JP); Tadashi Nakatani, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/012,104

(22) Filed: Jan. 24, 2011

(65) Prior Publication Data

US 2011/0223702 A1 Sep. 15, 2011

(30) Foreign Application Priority Data

Mar. 12, 2010 (JP) ................................ 2010-056565

(51) Int. Cl.
*H01L 21/00* (2006.01)

(52) U.S. Cl. .............. 438/50; 438/52; 438/53; 438/311; 257/E21.32; 257/E21.561

(58) Field of Classification Search .................... 438/50, 438/52, 53, 311; 257/347, 415, E27.112, 257/E21.32, E21.561
See application file for complete search history.

(56) References Cited

U.S. PATENT DOCUMENTS 7,472,984 B2 * 1/2009 Silverbrook .................... 347/54
2002/0031155 A1 * 3/2002 Tayebati et al. ................. 372/50
2003/0227361 A1 * 12/2003 Dickens et al. ................. 335/78
2005/0193827 A1 9/2005 Fischer
2005/0225921 A1 10/2005 Nakatani
2005/0280106 A1 12/2005 Kim
2006/0205106 A1 * 9/2006 Fukuda et al. .................. 438/52
2007/0176717 A1 * 8/2007 Nguyen et al. .................. 335/78

FOREIGN PATENT DOCUMENTS

JP 2005-246601 A1 9/2005
JP 2005-293918 A1 10/2005
JP 2006-7407 A1 1/2006
JP 2006-175555 A1 7/2006

* cited by examiner

*Primary Examiner* — Khiem D Nguyen
(74) *Attorney, Agent, or Firm* — Kratz, Quintos & Hanson, LLP

(57) ABSTRACT

A method for manufacturing a MEMS device, includes: preparing a substrate provided with a first substrate in which a cavity is formed, and a second substrate that is bonded to a side of the first substrate on which the cavity is formed and includes a slit to delimit a movable portion in a position corresponding to the cavity, the second substrate, including a first surface thereof facing the first substrate, being provided with a thermally-oxidized film selectively formed on the first surface in a position corresponding to the movable portion; forming a first electrode layer on a second surface opposite to the first surface on which the thermally-oxidized film for the movable portion is formed; forming a sacrifice layer on the first electrode layer and the second substrate; forming a second electrode layer on the sacrifice layer; and removing the sacrifice layer and the thermally-oxidized film after the second electrode layer is formed.

4 Claims, 14 Drawing Sheets

MANUFACTURING METHOD OF MEMS DEVICE, AND SUBSTRATE USED THEREFOR

CROSS-REFERENCE TO RELATED APPLICATION

This application is based upon and claims the benefit of priority of the prior Japanese Patent Application No. 2010-056565, filed on Mar. 12, 2010, the entire contents of which are incorporated herein by reference.

FIELD

The embodiments discussed herein are directed to a manufacturing method of a MEMS device, and a substrate used therefor.

BACKGROUND

In recent years, devices having a micro structure and produced by a micro-machining technology, which is sometimes called "MEMS (Micro Electro Mechanical Systems) technology", have been put into applications in a variety of fields.

The MEMS devices include such types as a MEMS switch, a MEMS capacitor, a MEMS sensor, and so on for a high-frequency circuit. For example, the MEMS switch has an advantageous feature, as compared with a conventional semiconductor switch, such as a small loss, high insulating properties, and good distortion properties.

As a conventional technology, Japanese Laid-open Patent Publication No. 2005-293918 proposes a MEMS switch in which a movable portion is formed on a substrate, and a contact provided to the movable portion makes contact with a contact electrode provided in a fixed manner relative to the substrate.

In a MEMS device, the movable portion is fabricated by using, for example, an ordinary SOI wafer and applying a D-RIE process only to the active layer (device layer) thereof. Alternatively, the movable portion is sometimes fabricated by laminating Poly-Si, Poly-SiGe, or the like on the wafer as a device layer, and applying an etching process or removing a sacrifice layer. Depending on the MEMS device, there is also a method to fabricate the movable portion by bonding a layer to a base wafer, and applying a D-RIE process. Among these processes, the process of removing the sacrifice layer to make a structure laminated on lower and upper layers of the sacrifice layer movable is called a surface MEMS process.

FIG. 13 is a plan view illustrating an example of a MEMS switch 80*j*, and FIG. 14 is a cross sectional view of the MEMS switch 80*j* illustrated in FIG. 13 taken along a line J-J.

Referring to FIGS. 13 and 14, the MEMS switch 80*j* includes a substrate 81, a lower contact electrode 82, an upper contact electrode 83, a lower driving electrode 84, an upper driving electrode 85, and so on, all of which are formed on the substrate 81. The lower contact electrode 82 and the lower driving electrode 84 are integrally provided to a movable portion KBj that constitutes a cantilever.

An SOI substrate is used as the substrate 81. The movable portion KBj is formed by cutting off the active layer of the SOI substrate by a slit SL. The lower contact electrode 82 and the lower driving electrode 84 are formed on the active layer by plating.

When a driving voltage is applied between the upper driving electrode 85 and the lower driving electrode 84, an electrostatic attractive force is generated therebetween, with which the lower driving electrode 84 is attracted toward and moved to the upper driving electrode 85. In this way, the movable portion KBj and the lower contact electrode 82 that are integrated with the lower driving electrode 84 move, and the lower contact electrode 82 touches the upper contact electrode 83 so that the contacts close. At this time, if the driving voltage is set at zero, the contacts return to the positions separated from each other due to the elasticity of the movable portion KBj.

The MEMS switch 80*j* described above has a structure in which a cavity is present below the lower surface of the movable portion KBj, and only one end of the movable portion KBj is connected to and supported by the substrate 81. The movable portion KBj is capable of bending upward and downward with the supported portion serving as a fulcrum point.

During a process of manufacturing the MEMS switch 80*j*, when an electrode having a coefficient of thermal expansion larger than that of the base material is laminated on the upper surface of the movable portion KBj, and when the temperature goes down to a room temperature, a stress is generated to cause the movable portion KBj to warp upwardly. When a sacrifice layer such as $SiO_2$ is further laminated thereon, the laminated sacrifice layer generates a stress which causes the movable portion KBj to warp downwardly. Although the warpage of the movable portion KBj caused by the electrode is small, for example, about 0.3 μm, the downward warpage of the movable portion KBj caused by the sacrifice layer sometimes becomes, for example, about 1 μm of which the influence is great.

In other words, during a process of manufacturing the MEMS switch 80*j*, a half etching of the sacrifice layer is performed to form the contact of the upper contact electrode 83. However, if the movable portion KBj largely warps, the adjustment or the control of the etching depth can not be accurately performed. For this reason, the accuracy of the interelectrode gap between the contact of the upper contact electrode 83 and the lower contact electrode 82 after the sacrifice layer is removed is worsened. Accordingly, desired switching properties may not be obtained.

In addition, if large downward warpage of the movable portion KBj is caused, there are sometimes cases where the upper surface portion of the slit SL may not be completely filled with the sacrifice layer. In such a case, the resist or polymer may infiltrate into a gap of the slit SL during a post-process, which makes it difficult to remove such a substance by cleaning, and reduces yields.

SUMMARY

According to an aspect of the invention (embodiment), a method for manufacturing a MEMS device, includes: preparing a substrate provided with a first substrate in which a cavity is formed, and a second substrate that is bonded to a side of the first substrate on which the cavity is formed and includes a slit to delimit a movable portion in a position corresponding to the cavity, the second substrate, including a first surface thereof facing the first substrate, being provided with a thermally-oxidized film selectively formed on the first surface in a position corresponding to the movable portion; forming a first electrode layer on a second surface opposite to the first surface on which the thermally-oxidized film for the movable portion is formed; forming a sacrifice layer on the first electrode layer and the second substrate; forming a second electrode layer on the sacrifice layer; and removing the sacrifice layer and the thermally-oxidized film after the second electrode layer is formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

[MEMS Switch]

In this embodiment, a MEMS switch 1 is taken as an example of a MEMS device, and a description will be given thereof. Various structures may be employed as a MEMS switch other than those in the examples described hereinafter. Manufacturing methods described later can also be applied to various types of MEMS devices such as a MEMS capacitor other than a MEMS switch.

Figure 1:
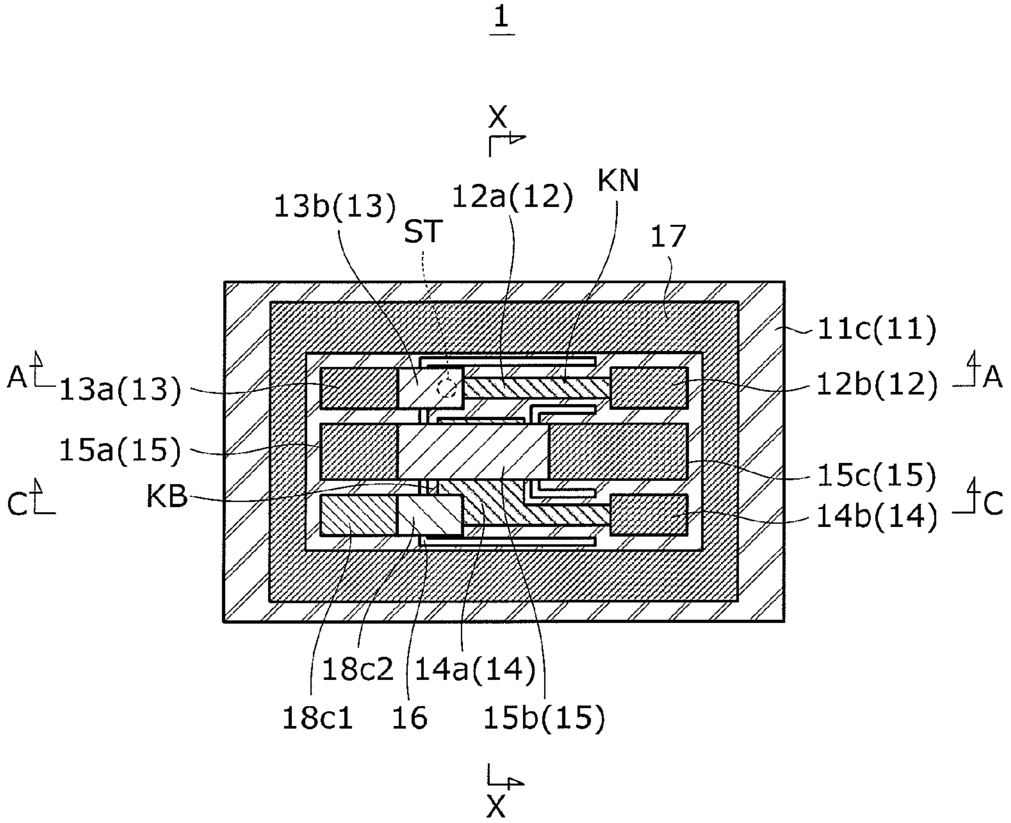
FIG. 1 is a plan view of a MEMS switch according to the present embodiment.
Figure 2A:
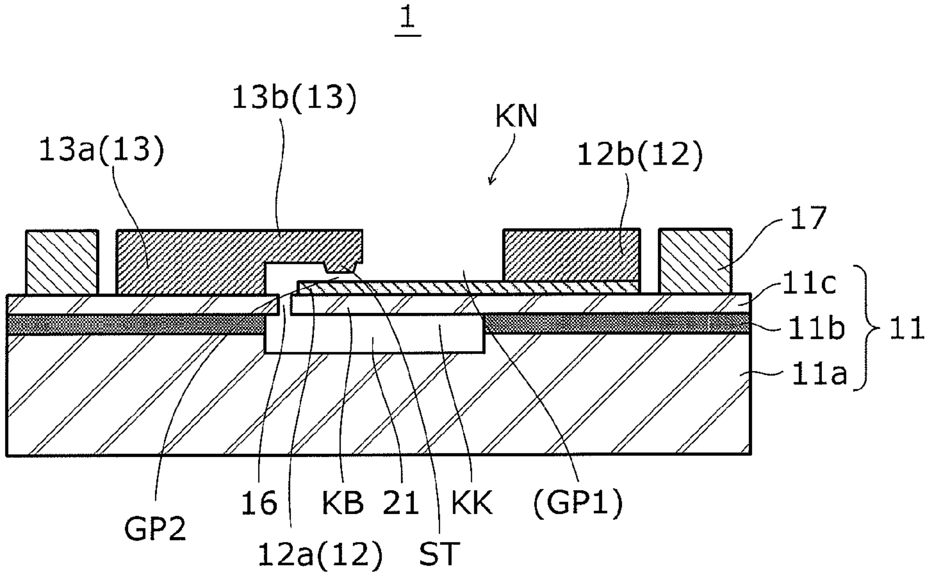
FIGS. 2A and 2B are cross sectional views of the MEMS switch illustrated in FIG. 1.
Figure 2B:
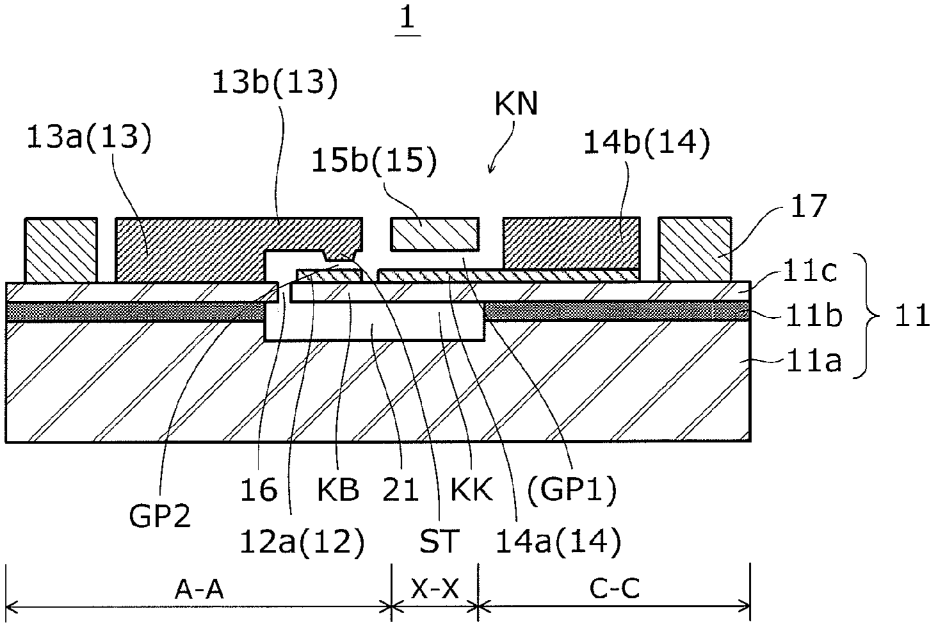

FIG. 1 is a plan view of a MEMS switch 1 according to one embodiment. FIG. 2A is a cross sectional view taken along a line A-A in FIG. 1. FIG. 2B is a cross sectional view of the MEMS switch 1 illustrated in FIG. 1 including a portion taken along a step-like line and partially taken along in a revolving manner. To be specific, FIG. 2B is a revolved sectional view, including a portion i) taken along a line starting from "A" indicated in the left side of FIG. 1 and ending at a point at which a line A-A intersects with a line X-X, a portion ii) taken along a line staring from the point at which the line A-A intersects with the line X-X and ending at a point at which the line X-X intersects with a line C-C, and a portion iii) starting from the point at which the line X-X intersects with the line C-C and ending at a point where "C" is indicated in the right side of FIG. 1. However, the illustration of the portion ii) is partially omitted. It should be noted that FIGS. 3A-3C, 4A-4C, and 11A-11D of which descriptions will be given later are also illustrated in a manner similar to FIG. 2B.

Referring to FIGS. 1, 2A, and 2B, the MEMS switch 1 includes an SOI substrate 11, a movable contact electrode 12, a fixed contact electrode 13, a movable driving electrode 14, a fixed driving electrode 15, a wall portion 17, a support portion 18, and so on.

The SOI substrate 11 is a three-layer SOI (Silicon On Insulator) substrate formed of a support substrate (handle layer) 11*a*, a BOX layer (intermediate oxide film layer) 11*b*, and an active layer (device layer) 11*c*. The support substrate 11*a* is made of silicon having a thickness of about 500 μm. The BOX layer 11*b* is an insulating layer made of $SiO_2$ having a thickness of about 4 μm. The active layer 11*c* is a silicon thin film having a thickness of about 15 μm.

The active layer 11*c* is provided with a slit 16 having a horizontal U-shape in a front view (plan view). This means that the movable portion KB is delimited by the slit 16. The support substrate 11*a* is provided with a cavity (space) 21 corresponding to a region including the movable portion KB.

In other words, the cavity 21 is provided in a manner to extend to an inner surface of the active layer 11*c* (lower side of the active layer 11*c* in the illustration) in the support substrate 11*a*. Here, during the manufacturing process of the MEMS switch 1, although an oxide film layer having been subjected to patterning is formed on a surface of the active layer 11*c* in the cavity 21, the oxide film layer will be removed later.

In addition, a layer similar to the BOX layer 11*b* may be formed continuously from the BOX layer on a surface (surrounding surface) other than that of the active layer 11*c* in the cavity 21. The manufacturing process of the MEMS switch 1 will be described in detail later.

The movable portion KB constitutes a cantilever with a portion in which the slit 16 is not provided serving as a fulcrum, warps with the fulcrum or the vicinity thereof serving as a center of warpage, and an end portion opposite to the fulcrum can move in upper and lower directions in FIGS. 2A and 2B. Electrode portions 12*a* and 14*a*, which will be described later, are formed in intimate contact with the surface of the movable portion KB.

The movable contact electrode 12 includes the electrode portion 12*a* that is thin and elongated and formed in intimate contact with the movable portion KB, and the anchor portion 12*b* formed on one end portion of the electrode portion 12*a*.

The fixed contact electrode 13 includes an electrode base portion 13*a* formed in intimate contact with the active layer 11*c*, and a fixed contact portion 13*b* provided continuously from the electrode base portion 13*a* in a manner to oppose thereto above the electrode portion 12*a*. The fixed contact portion 13*b* is provided with a contact portion ST.

An openable and closable contact is formed between the electrode portion 12*a* and the contact portion ST of the fixed contact portion 13*b*. The contact closes when the movable portion KB warps upward to thereby cause the electrode portion 12*a* to make contact with the fixed contact portion 13*b*. A signal line SL is formed of the movable contact electrode 12 and the fixed contact electrode 13. When the contact closes, the signal line SL passes a high-frequency signal therethrough.

The movable driving electrode 14 includes an electrode portion 14*a* formed of an elongated portion formed in intimate contact with the movable portion KB and a rectangular portion formed continuously from a front end portion of the elongated portion, and an anchor portion 14*b* formed on one end portion of the electrode portion 14*a*.

The fixed driving electrode 15 is formed of electrode base portions 15*a* and 15*c* that are formed in intimate contact with the active layer 11*c*, and an electrode opposing portion 15*b* that is supported by the electrode base portions 15*a* and 15*c* and forms a bridge straddling the movable portion KB thereabove. The electrode opposing portion 15*b* faces the rectangular portion of the electrode portion 14*a* thereabove.

The wall portion 17 is provided, on the SOI substrate 11, in a rectangular frame shape so as to surround the movable contact electrode 12, the fixed contact electrode 13, the movable driving electrode 14, the fixed driving electrode 15, and so on. The height of the wall portion 17 is the same as or higher than the other electrodes.

A metallic material, for example, gold is used as a material for the movable contact electrode 12, the fixed contact electrode 13, the movable driving electrode 14, the fixed driving electrode 15, and the wall portion 17.

Sometimes, a membrane material 20 is bonded onto the wall portion 17 to seal space including functional portion KN such as the movable contact electrode 12, the fixed contact electrode 13, the movable driving electrode 14, the fixed driving electrode 15, and the like, that is, the space surrounded by the wall portion 17, against outside.

[Manufacturing Method of MEMS Switch]

Next, a description will be given of a manufacturing method of the MEMS switch 1.

Figure 3A:
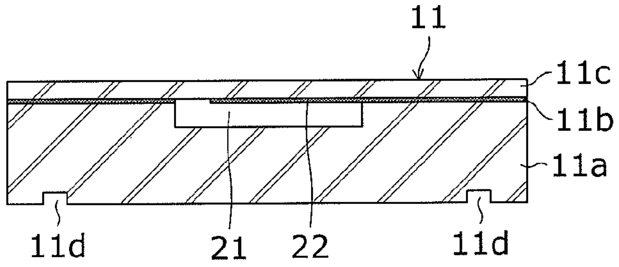
FIGS. 3A, 3B, and 3C are diagrams illustrating a manufacturing process of the MEMS switch according to the present embodiment.

As illustrated in FIG. 3A, the SOI substrate 11 is prepared. As described before, the SOI substrate 11 includes the support substrate 11*a*, the BOX layer 11*b*, and the active layer 11*c*. According to the SOI substrate 11 used in this embodiment, the cavity 21 is further provided to the support substrate 11*a*, and an oxide film layer 22 is formed on a surface in the cavity 21 on the side of the active layer 11*c*.

Figure 6A:
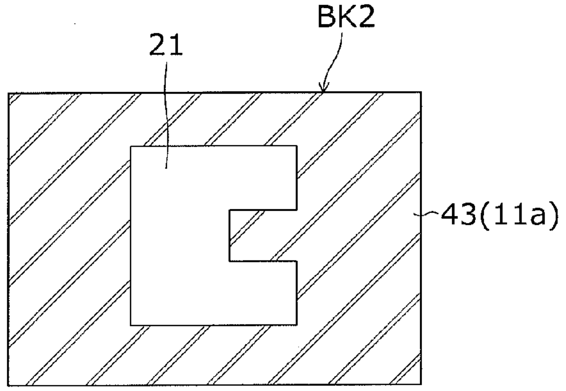
FIGS. 6A, 6B, and 6C are diagrams illustrating a manufacturing process of the SOI substrate.

The cavity 21 and the oxide film layer 22 are formed during the course of the production of the SOI substrate 11. Referring to FIG. 6A, the cavity 21, in plan view, has a shape including a region corresponding to the movable portion KB of the MEMS switch 1 and a region correspond to the slit 16. The depth of the cavity 21 is, for example, about a few μm to a few dozens μm.

Figure 5A:
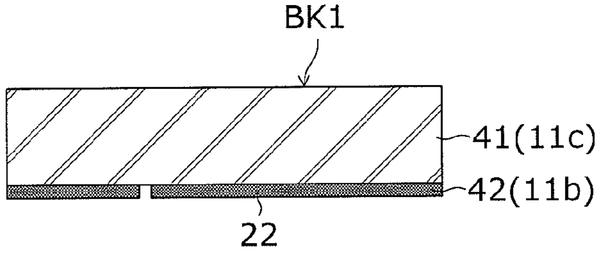
FIGS. 5A and 5B are diagrams illustrating the manufacturing process of an SOI substrate.
Figure 5B:
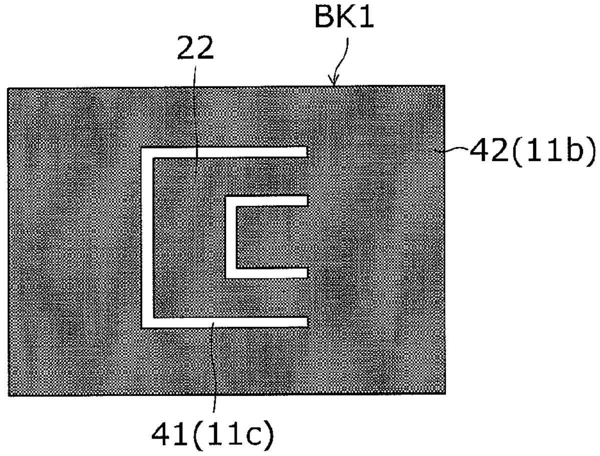
Figure 7A:
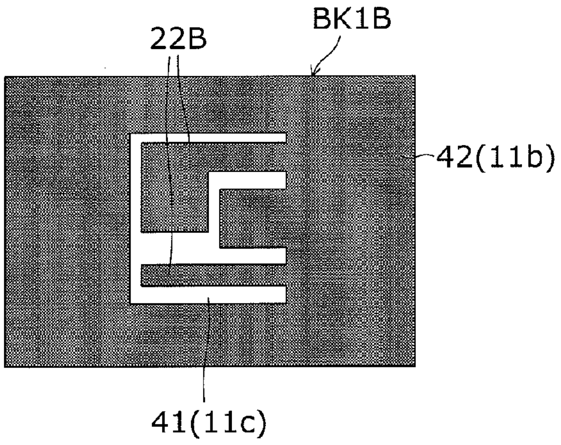
FIGS. 7A and 7B are diagrams illustrating the manufacturing process of the SOI substrate.

Referring to FIG. 5B, the oxide film layer 22, in plan view, has the same shape as that of the movable portion KB of the MEMS switch 1. Referring to FIG. 7A, alternatively, the shape of the oxide film layer 22 in plan view may be arranged identical to the shape of the lower electrode layer formed on a side of an upper surface of the movable portion KB, that is a combination of a shape of the electrode portion 12*a* and a shape of the electrode portion 14*a*. Yet alternatively, the shape of the oxide film layer 22 in plan view may be arranged as a shape corresponding to the above-mentioned shape but not identical. The oxide film layer 22 is, for example, a thermally-oxidized film made of, for example, $SiO_2$ and having a thickness of about 0.1 μm to a few μm, e.g., about 0.1 μm to 2 μm.

Concave portions 11*d* for positioning are provided on the lower side of the outer surface of the support substrate 11*a*.

Figure 3B:
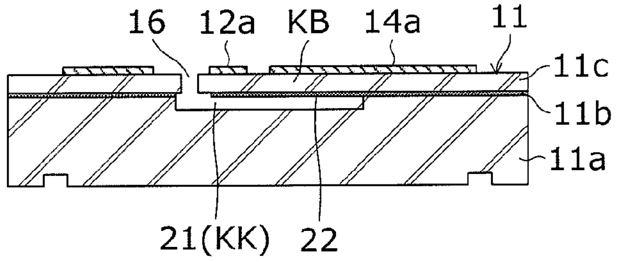

Next, a metallic layer serving as the lower electrode layer is formed by performing sputtering or the like using a metallic material on the surface of the active layer 11*c* of the SOI substrate 11. Then, as illustrated in FIG. 3B, patterning is performed on the metallic layer thus formed through a process of RIE of the like to form the electrode portion 12*a*, the electrode portion 14*a*, and the like.

Further, the slit 16 is formed along a pattern of the cantilever of the movable portion KB by performing photolithography, D-RIE, and the like on the active layer 11*c*. The width of the slit 16 is, for example, about 1 μm to 2 μm.

When the slit 16 is formed, the slit 16 is connected to the cavity 21 to thereby form the movable portion KB which serves as a cantilever. In addition, space KK which is sufficient for the movable portion KB to be operated and deformed therein is formed by the cavity 21.

When the electrode portion 12*a* and the electrode portion 14*a* are formed in the movable portion KB, slight upward warpage is caused in the movable portion KB due to a difference between coefficients of thermal expansion of the metallic material and the material for the active layer 11*c*, and also changes in the temperature during the process. Specifically, when the temperature during the process goes down to a room temperature, a tensile stress of the metallic material having a larger coefficient of thermal expansion exceeds that of the active layer 11*c*. This generates a stress that causes warpage toward the side of the electrode portion 12*a*, that is, toward upper side in the drawing.

Since the material used for the oxide film layer 22 has a coefficient of thermal expansion larger than that of the material used for the active layer 11*c*, the presence of the oxide film layer 22 causes an action of the warpage to become larger toward the upper side of the movable portion KB. However, such warpage can be figured out in terms of scale by managing the process. This makes it possible to perform control for correcting the warpage as required in the post-process.

Figure 3C:
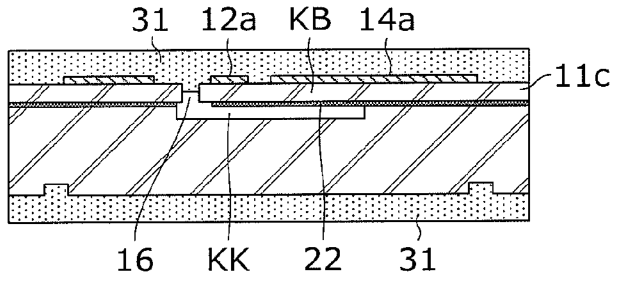

Next, as illustrated in FIG. 3C, the sacrifice layer 31 is formed by lamination on the active layer 11, the electrode portions 12*a* and 13*a*, and the like by using $SiO_2$ etc. The temperature during the formation of the sacrifice layer 31 is, for example, about 150° C. The thickness of the sacrifice layer 31 is about a few μm to a few dozens for example, about 5 μm.

By forming the sacrifice layer 31, a stress is generated to cause the movable portion KB to warp downwardly because of the difference in the coefficient of thermal expansion and the change in the temperature. However, since the oxide film layer 22 is formed on the lower surface of the movable portion KB, the stress causing the sacrifice layer 31 to warp downwardly is reduced or cancelled by the stress generated by the oxide film layer 22 which causes the upward warpage.

To be specific, the combined stress resulted from the stress caused by the oxide film layer 22 and the stress caused by the electrode portions 12*a* and 14*a* etc. is the stress that acts on the movable portion KB and causes the upward warpage. On the other hand, the stress caused by the sacrifice layer 31 is the stress that acts on the movable portion KB and causes the downward warpage. Thus, the stress that causes the movable portion KB to warp downward is reduced or cancelled by the stress that causes the movable portion KB to warp upward. To put it differently, these stresses balance with each other to substantially maintain the horizontal condition of the movable portion KB. As a result, the warpage caused by the formation of the sacrifice layer 31 disappears or reduces.

The presence of the oxide film layer 22 greatly influences the reduction of the warpage of the movable portion KB caused by the formation of the sacrifice layer 31. Therefore, such an oxide film layer 22 that reduces or cancels the warpage of the movable portion KB caused by the formation of the sacrifice layer 31 is selectively formed in advance.

Since the warpage of the movable portion KB caused by the formation of the sacrifice layer 31 is reduced, the sacrifice layer 31 can be continuously formed without interruptions on the upper portion of the slit 16. For this reason, the resist or polymer does not infiltrate into the slit 16 contrary to the conventional case. Here, the sacrifice layer 31 does not come into the cavity 21.

Figure 4A:
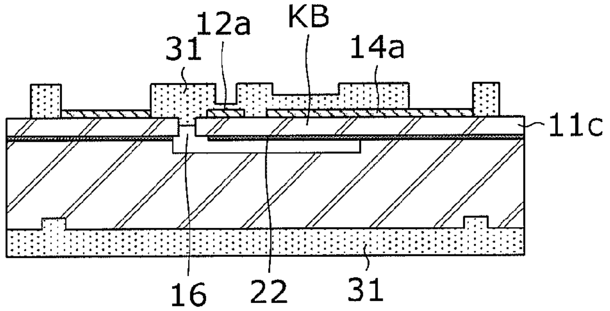
FIGS. 4A, 4B, and 4C are diagrams illustrating the manufacturing process of the MEMS switch according to the present embodiment.

Next, as illustrated in FIG. 4A, half-etching is performed the required number of times, and subsequently patterning is performed on the sacrifice layer 31 to selectively reduce the film thickness of the sacrifice layer 31. The depth of the half-etching performed on the sacrifice layer 31 is controlled to thereby adjust an interelectrode gap GP2 between the electrode portion 12*a* and the contact portion ST of the fixed contact portion 13*b* which will be formed later.

Figure 4B:
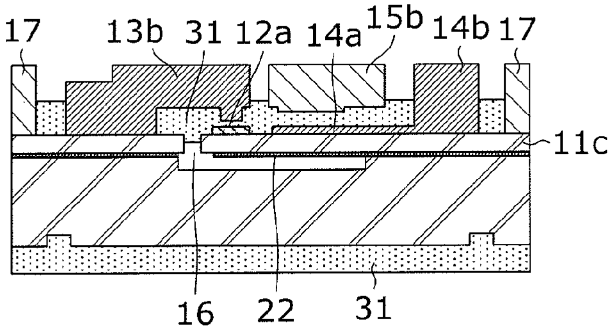

Next, as illustrated in FIG. 4B, a seed layer is formed, as necessary, on the electrode portions 12*a* and 14*a*, the sacrifice layer 31, and the like, and plating or the like is performed using a metallic material. Through this process, a metallic layer serving as an upper electrode layer such as for the fixed contact portion 13*b* and the electrode opposing portion 15*b*, and as a structural body such as for the anchor portion 14*b*, the wall portion 17, or the support portion 18.

Figure 4C:
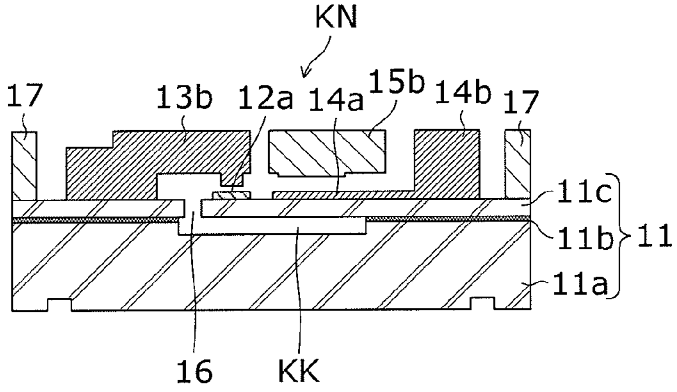

Subsequently, as illustrated in FIG. 4C, the sacrifice layer 31 and the oxide film layer 22 are removed by etching using HF (hydrofluoric acid) vapor etc. Through this process, the functional portion KN of the MEMS switch 1 is completed and ready for operation as the MEMS switch 1.

The membrane material 20 is bonded onto the wall portion 17 as necessary. In the case where the SOI substrate 11 is a disc-shaped wafer, a plurality of pieces of MEMS switch 1 formed on the SOI substrate 11 are cut out into individual pieces of MEMS switch 1 by dicing along the wall portion 17.

In this way, by using the SOI substrate 11 having the support substrate 11*a* in which the cavity 21 is provided, and the oxide film layer 22 formed on a surface in the cavity 21 on the side of the active layer 11*c*, it is possible to reduce the warpage of the movable portion KB caused when the sacrifice layer 31 is formed as much as possible.

Furthermore, since the warpage of the movable portion KB caused when the sacrifice layer 31 is formed is small, the half-etching of the sacrifice layer 31 can be accurately performed, and the size of the interelectrode gap GP2 etc. between the electrode portion 12*a* and the contact portion ST of the fixed contact portion 13*b* can be accurately adjusted.

Figure 11A:
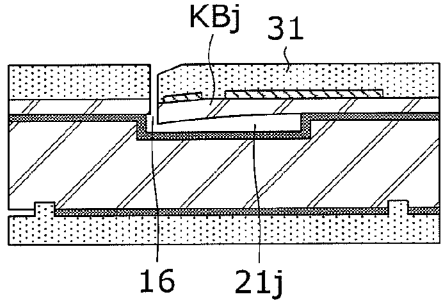
FIGS. 11A, 11B, 11C, and 11D are diagrams illustrating comparative examples of manufacturing processes of the MEMS switch.

For example, if the oxide film layer 22 is not provided on the inner surface of the cavity 21*j*, the downward warpage of the movable portion KBj caused when the sacrifice layer 31 is formed becomes larger, for example, as illustrated in FIG. 11A. For example, there is sometimes a case where the movable portion KBj sags by about 1 μm from the surface of the active layer 11*c*. For this reason, there may be a case where the sacrifice layer 31 sinks in the upper portion of the slit 16 and breaks. The resist or polymer may infiltrate into such a portion. Instead, the thickness of the sacrifice layer 31 in the vicinity of the slit 16 may fluctuate.

Figure 11B:
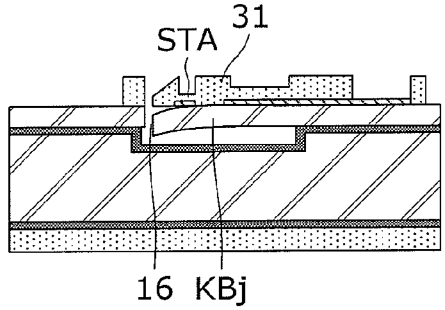
Figure 11C:
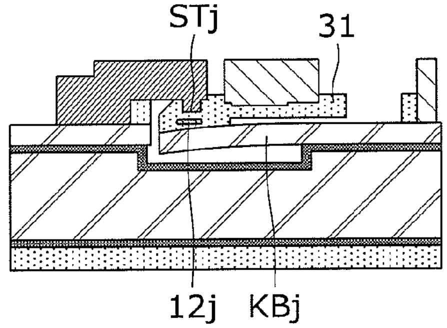

In addition, for example, as illustrated in FIG. 11B, the depth of a hole STA for the contact portion STj of the fixed contact portion 13*b*, when the sacrifice layer 31 is half-etched, can not be accurately controlled. As a result, for example, as illustrated in FIG. 11C, the accuracy of the interelectrode gap GP between the contact portion STj and the electrode portion 12*j* is worsened when the metallic layer is formed by plating.

Figure 11D:
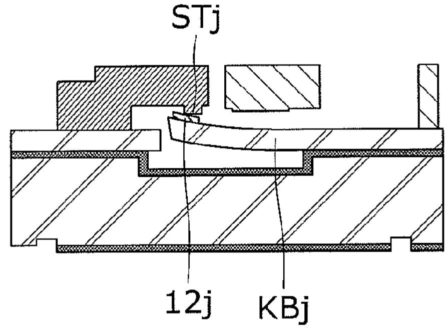

For example, as illustrated in FIG. 11D, after the sacrifice layer 31 is released, the movable portion KBj may warp upwardly as a reaction of the downward warpage thereof. If this occurs, the electrode portion 12*j* may be constantly kept in contact with the contact portion STj. In such a case, the MEMS switch 1 is determined faulty, which reduces yields.

[Manufacturing Method of SOI Substrate]

Referring to FIGS. 5A-10B, a description will be given of the manufacturing method of the SOI substrate 11.

First, a description will be given of an upper substrate BK1 and a lower substrate BK2 that are components for manufacturing the SOI substrate 11.

Figure 6B:
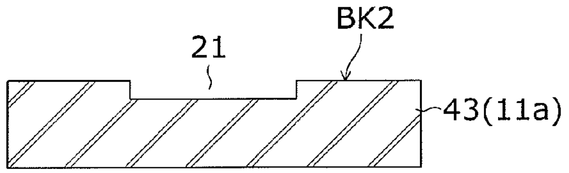
Figure 6C:
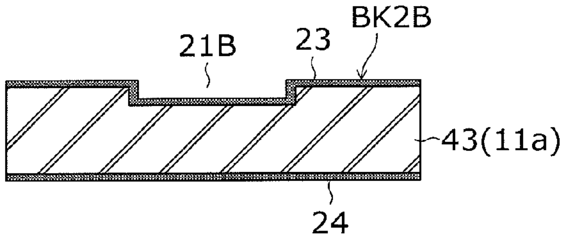

FIGS. 5A and 5B illustrate the upper substrate BK1 to be used for producing the SOI substrate 11. FIG. 5A is a sectional side view, and FIG. 5B is a bottom view. FIGS. 6A-6C illustrate the lower substrate BK2 to be used for producing the SOI substrate 11. FIG. 6A is a plan view, and FIGS. 6B and 6C are cross sectional views.

Referring to FIGS. 5A and 5B, the upper substrate BK1 is resulted from forming a thermally-oxidized film 42 on a lower surface of a silicon plate 41. The silicon plate 41 is a portion to be polished and serves as the active layer 11*c* later, and the thermally-oxidized film 42 is to serve as the BOX layer 11*b* later.

As illustrated in FIG. 5B, the portion of the thermally-oxidized film 42 which will serve as the movable portion KB later is patterned in a shape identical to that of the movable portion KB on which the oxide film layer 22 is formed.

Referring to FIGS. 6A and 6B, the lower substrate BK2 is resulted from forming the cavity 21 in the upper surface of the silicon plate 43 by D-RIE, wet etching, or the like. The planar shape of the cavity 21 is a shape that corresponds to a region including a portion to be turned to the movable portion KB. The silicon plate 43 is a portion that turns to be the support substrate 11*a* later.

FIG. 6C illustrates a variation example of the lower substrate BK2B. As the lower substrate BK2B illustrated in FIG. 6C, the oxide film layers 23 and 24 formed of SiO2 etc. may be formed on the entire upper and lower surfaces of the silicon plate 43. The entire upper and lower surfaces of the silicon plate 43 including the wall surface of the cavity 21B are covered with the insulating layer by the oxide film layers 23 and 24.

In the manufacturing process of the SOI substrate 11, the upper substrate BK1 and the lower substrate BK2 are bonded together so that the surface of the oxide film layer 22 coincides with a surface of the silicon plate 43 in which the cavity 21 is provided.

Figure 7B:
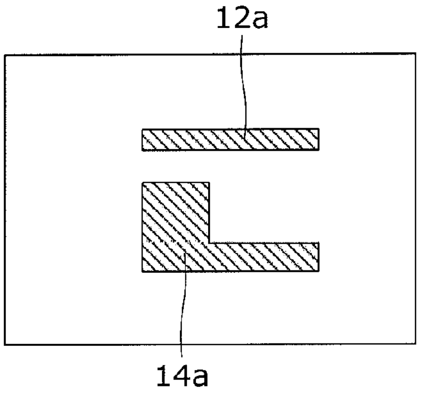

Alternatively, as illustrated in FIGS. 7A and 7B, the shape of the oxide film layer 22 of the upper substrate BK1 may be made identical with the shapes of the electrode portions 12*a* and 14*a* formed on the upper side of the movable portion KB.

FIG. 7B illustrates, in plan view, the shapes of the electrode portions 12*a* and 14*a* formed in the movable portion KB, and FIG. 7A illustrates, in bottom view, the patterning for the oxide film layer 22B formed on the thermally-oxidized film 42 of the upper substrate BK1B. In these illustrations, the shapes of the electrode portions 12*a* and 14*b* and the shape of the oxide film layer 22B are in a mirror image relationship.

Next, the manufacturing process of the SOI substrate 11 will be described.

Figure 8A:
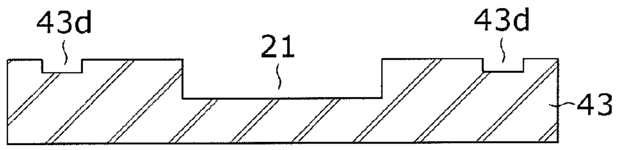
FIGS. 8A, 8B, and 8C are diagrams illustrating the manufacturing process of the SOI substrate.
Figure 8B:
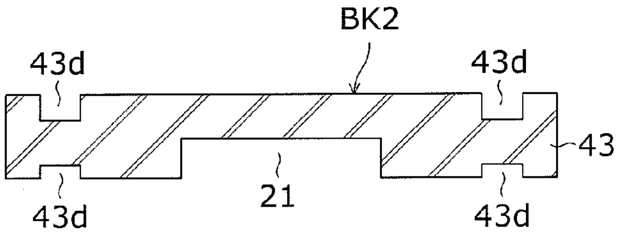

As illustrated in FIG. 8A, the cavity 21 is formed on one side of the silicon plate 43 which is to serve as the lower substrate BK2, and the concave portion (alignment marker) 43*d* for positioning is also formed. As illustrated in FIG. 8B, another concave portion 43*d* is also formed on the other side of the silicon plate 43 to serve as the lower substrate BK2.

Figure 8C:
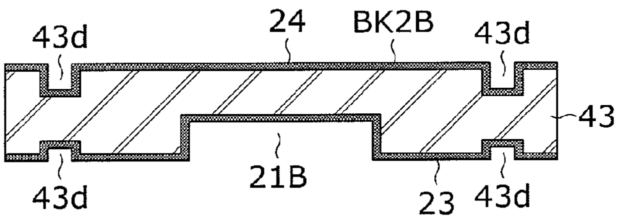

As illustrated in FIG. 8C, the oxide film layers 23 and 24 are individually formed on two sides of the silicon plate 43 entirely as necessary to thereby form the lower substrate BK2B.

Figure 9A:
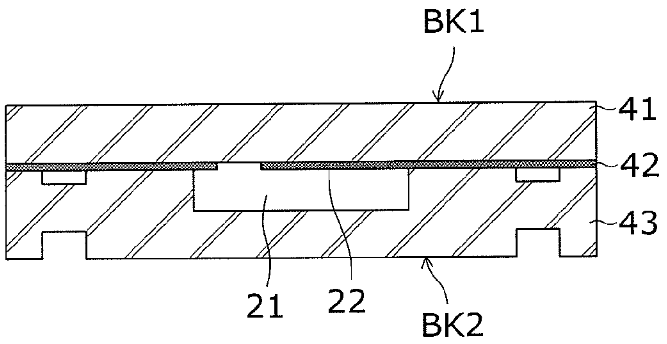
FIGS. 9A and 9B are diagrams illustrating the manufacturing process of the SOI substrate.

As illustrated in FIG. 9A, the upper substrate BK1 illustrated in FIGS. 5A and 5B or, alternatively, the upper substrate BK1B illustrated in FIGS. 7A and 7B is bonded to the upper surface of the lower substrate BK2 illustrated in FIG. 8B. In this bonding process, for example, hydrophilic processing is performed on the bonding surfaces, and two surfaces are placed together which are then subjected to an annealing treatment at a high temperature of about 1000° C.

Figure 9B:
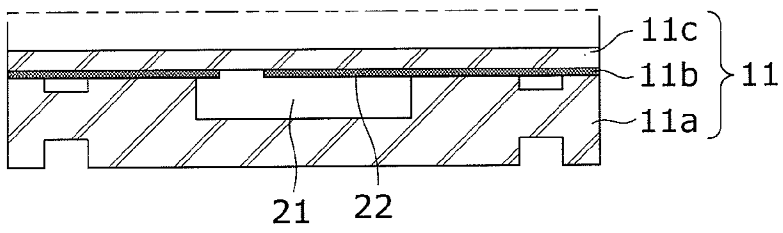

Next, as illustrated in FIG. 9B, the surface of the silicon plate 41 is polished to a predetermined thickness required as the active layer 11*c*.

Through this process, the thermally-oxidized film 42 turns to be the BOX layer 11*b*, and the silicon plate 43 turns to be the support substrate 11*a*. The cavity 21 extends to the surface inside the active layer 11*c* in the support substrate 11*a* where the oxide film layer 22 which has been subjected to patterning is formed.

Figure 10A:
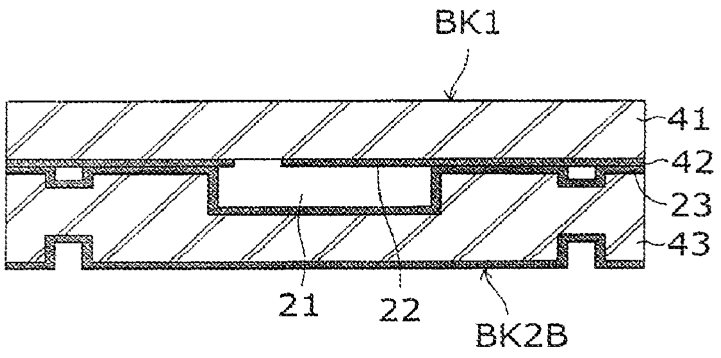
FIGS. 10A and 10B are diagrams illustrating the manufacturing process of the SOI substrate.
Figure 10B:
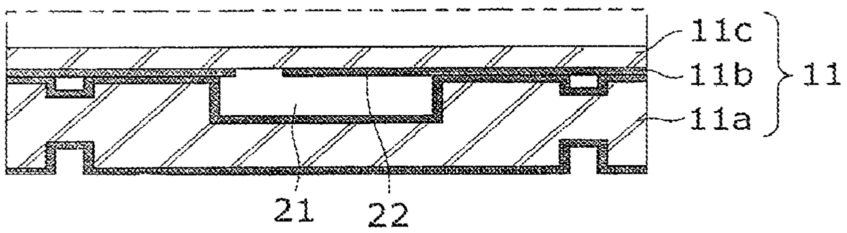

Further, as illustrated in FIG. 10A, the upper substrate BK1 illustrated in FIGS. 5A and 5B or, alternatively, the upper substrate BK1B illustrated in FIGS. 7A and 7B is bonded to the upper surface of the lower substrate BK2B illustrated in FIG. 8C. Next, as illustrated in FIG. 10B, the surface of the silicon plate 41 is polished to a predetermined thickness required as the active layer 11*c*.

Through this process, the thermally-oxidized film 42 and the oxide film layer 23 turn to be the BOX layer 11*b*, and the silicon plate 43 turns to be the support substrate 11*a*. The cavity 21 extends to the surface inside the active layer 11*c* in the support substrate 11*a* where the oxide film layer 22, which has been subjected to patterning, is formed. The oxide film layer 23 is formed in the other portion of the inner surface of the cavity 21.

As described above, the SOI substrate 11 is produced by bonding together the lower substrate BK2 having the cavity 21 and the upper substrate BK1 having the oxide film layer 22 that has undergone the patterning. During this process, an oxide film layer 22 is formed and subjected to patterning so that the oxide film layer 22 causes a stress of the same quality as and equivalent to a stress that will be caused when the sacrifice layer 31 is formed later. This arrangement makes it possible to reduce the warpage that will be caused otherwise after the movable portion KB is formed.

Consequently, it is possible to suppress the warpage or depression of the movable portion KB during the manufacturing process of the MEMS switch 1 and perform accurate control of the dimensions during the formation of the electrode by applying half-etching to the sacrifice layer 31. Therefore, it is possible to manufacture the MEMS switch 1 having the desired driving properties at a higher yield rate.

In addition, since it is possible to adopt a process using a wafer of the SOI substrate 11 having the cavity 21, it is easy to arrange it in a wafer level package (WLP) structure that has a low profile and is implementable. Specifically, a single membrane material 20 is bonded onto an entire area in which a plurality of MEMS switches 1 are formed on the SOI substrate 11, and dicing is preformed thereafter. In this way, it is possible to manufacture individual MEMS switches 1 having a low profile in large quantity.

Hereinafter, a description will be given of the outline procedure of the manufacturing process of the MEMS switch 1 using the SOI substrate 11 referring to a flowchart.

Figure 12:
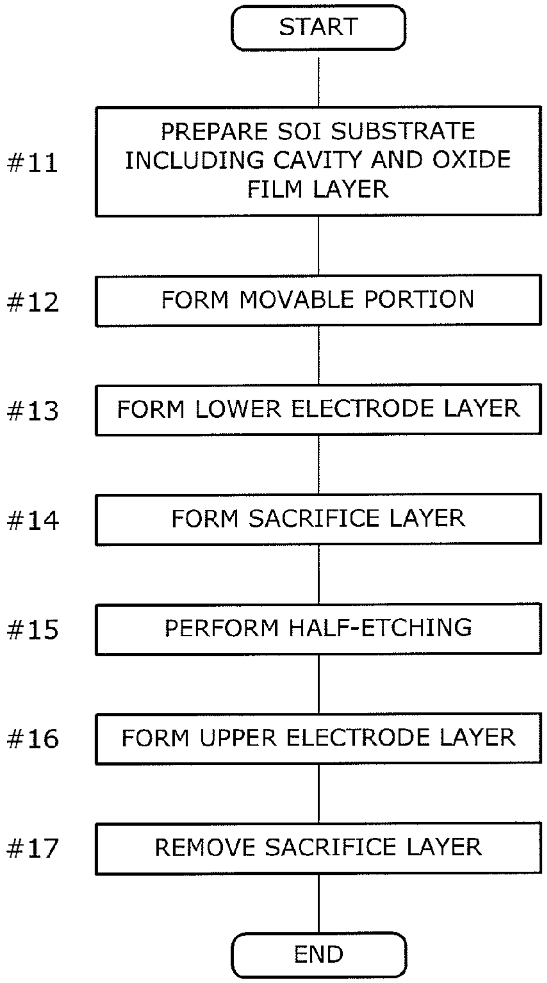
FIG. 12 is a diagram depicting an outline of the manufacturing method of the MEMS switch.
Figure 13:
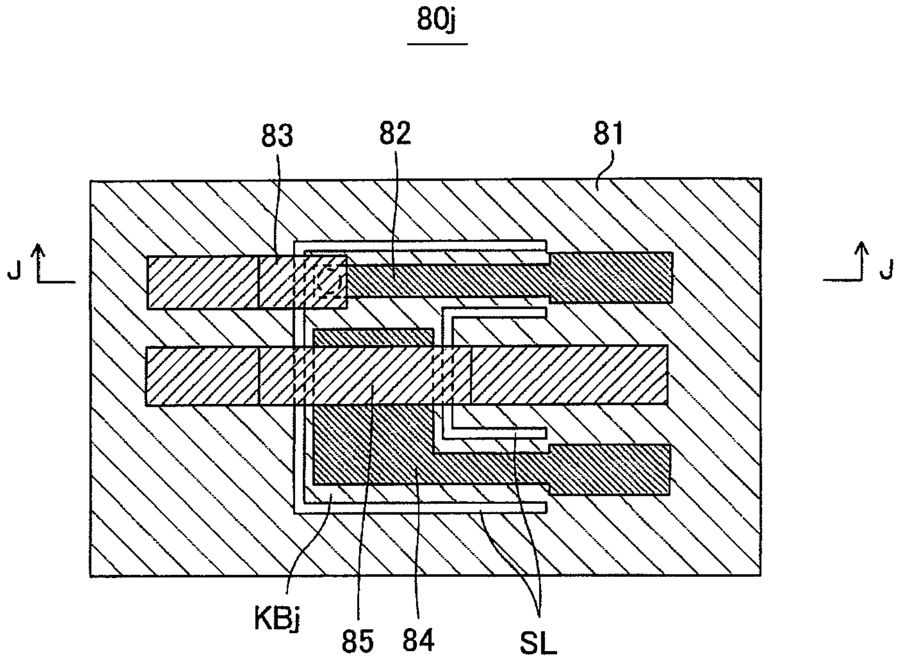
FIG. 13 RELATED ART
FIG. 13 is a plan view illustrating an example of a MEMS switch.
Figure 14:
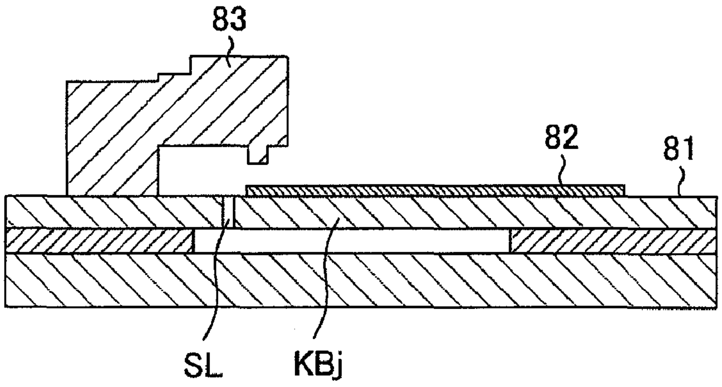
FIG. 14 RELATED ART
FIG. 14 is a cross sectional view illustrating the MEMS switch illustrated in FIG. 13 taken along a line J-J.

Referring to FIG. 12, an SOI substrate 11 is prepared. In the SOI substrate 11, the support substrate 11*a* is provided with a cavity 21, and the oxide film layer 22 is formed on the surface of the active layer 11*c* in the cavity 21 (step #11). Then, the slit 16 is arranged to form the movable portion KB (#12).

The lower electrodes such as the electrode portions 12*a* and 14*a* are formed on the movable portion KB (#13), and the sacrifice layer 31 is provided thereon (#14). Half-etching is performed on the sacrifice layer 31 to thereby perform patterning (#15). An upper electrode such as the fixed contact portion 13*b* is formed on the sacrifice layer 31 (#16). Then, the sacrifice layer 31 and the oxide film layer 22 are removed (#17).

According to the foregoing embodiment, during the manufacturing of the MEMS switch 1, the SOI substrate 11 is used. The SOI substrate 11 includes the support substrate 11*a* to which the cavity 21 is provided, and the oxide film layer 22 that is patterned on the inner surface of the active layer 11*c*. However, it is also possible to manufacture the MEMS switch 1 without using the above-mentioned SOI substrate 11 but using a different type of SOI substrate.

For example, it is possible to use an SOI substrate formed of the support substrate 11*a*, the BOX layer 11*b*, and the active layer 11*c* without having the cavity 21 formed therein. In this case, the cavity is produced from the rear side of the active layer 11*c* after the device structure is formed on the active layer 11*c*.

According to the foregoing embodiment, since the movable portion is fixed relative to the BOX layer when the side of the active layer is being processed, the movable portion KB is not caused to warp when the sacrifice layer 31 is formed. Therefore, it is possible to perform accurate control on the dimensions of the interelectrode gap GP2 between the electrode portion 12*a* and the contact portion ST of the fixed contact portion 13*b*. Instead of the distance between the electrode portion 12*a* and the contact portion ST or a distance between electrodes that make contact with each other, a distance between two electrodes that do not make contact with each other may be taken as the interelectrode gap GP2. This means that it is also possible to perform accurate control on dimensions of an interelectrode gap between the electrodes that do not make contact with each other.

In the foregoing embodiment, the overall configurations of the other portions such as the SOI substrate 11, the electrode portions 12*a* and 14*a*, the fixed contact portion 13*b*, the contact portion ST, the slit 16, the cavity 21, the oxide film layer 22, the sacrifice layer 31, the movable portion KB, and the MEMS switch 1, the configurations of various parts thereof, the structure, the shape, the material, the quantity, the layout, the temperature, the production method, and the like may be altered as required in accordance with the subject matter of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a MEMS device, comprising:

preparing a substrate provided with a first substrate and a second substrate bonded to the first substrate, the first substrate having a cavity formed in a manner to extend to a first surface serving as an inner surface of the second substrate, the second substrate having a thermally-oxidized film which has been subjected to patterning formed on the first surface in a position corresponding to the cavity;

forming a movable portion on the second substrate by forming a slit in a region facing the cavity, the movable portion being provided with the thermally-oxidized film on the first surface and being deformable to a space formed by the cavity;

forming a first electrode layer on a second surface opposite to the first surface for the movable portion;

forming a sacrifice layer on the first electrode layer and the second substrate;

forming a second electrode layer on the sacrifice layer; and removing the sacrifice layer and the thermally-oxidized film after the second electrode layer is formed.

2. The method for manufacturing a MEMS device according to claim 1, wherein a film thickness of the sacrifice layer is reduced after the sacrifice layer is formed.

3. The method for manufacturing a MEMS device according to claim 1, wherein the thermally-oxidized film is patterned in a shape identical to a shape of the movable portion.

4. The method for manufacturing a MEMS device according to claim 1, wherein the thermally-oxidized film is patterned in a shape identical to a shape of the first electrode layer.

* * * * *